(12) United States Patent
Gowni et al.

(10) Patent No.: US 6,357,035 B1
(45) Date of Patent: Mar. 12, 2002

(54) METHOD AND APPARATUS FOR THE AUTOMATED GENERATION OF PROGRAMMABLE INTERCONNECT MATRICES

(75) Inventors: Shiva P. Gowni, San Jose; Alpesh B. Patel, Fremont, both of CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/285,931

(22) Filed: Apr. 2, 1999

Related U.S. Application Data
(60) Provisional application No. 60/111,003, filed on Dec. 4, 1998.

(51) Int. Cl.[7] ............................................. G06F 17/50
(52) U.S. Cl. ........................................................ 716/11
(58) Field of Search .................................. 716/11, 1, 10, 716/2; 395/500.2, 500.06

(56) References Cited

U.S. PATENT DOCUMENTS 5,068,603 A    11/1991  Mahoney .................... 324/158
5,943,488 A  *  8/1999  Raza ........................ 395/500.2

* cited by examiner

Primary Examiner—David Nelms
Assistant Examiner—Thong Le
(74) Attorney, Agent, or Firm—Wagner, Murabito & Hao LLP

(57) ABSTRACT

A programmable interconnect matrix (PIM) design, layout, schematic, netlist, abstract or other equivalent circuit representation (hereinafter "layout") is hierarchically generated by selecting one or more PIM layout tiles from a plurality of different PIM layout tiles, and automatically compiling a plurality of the selected PIM layout tiles into a PIM layout. In some cases, the PIM layout tiles can be heterogeneous. Generally, the PIM layout includes a PIM array having one of a plurality of different sizes (e.g., n rows by m columns, n and m>1). In other embodiments, a PIM connection scheme is generated by automatically compiling a plurality of PIM layout tiles into a PIM layout, then programming interconnects of the PIM according to a mapping table specifying desired interconnections. This scheme may include generating the mapping table with software configured to optimize connections and/or routability and/or automatically generating a PIM layout database from the PIM connection scheme. Either or both of these methodologies may be embodied as a set of computer-readable instructions for performing the methods.

8 Claims, 2 Drawing Sheets

US 6,357,035 B1

METHOD AND APPARATUS FOR THE AUTOMATED GENERATION OF PROGRAMMABLE INTERCONNECT MATRICES

This appln claims benefit of Prov. No. 60/111,003 filed Dec. 4, 1998.

FIELD OF THE INVENTION

The present invention relates to schemes for the automated design of programmable devices and/or components thereof. In particular, the schemes described herein may be applied to develop programmable interconnect matrices for complex programmable logic devices (CPLDs), field programmable gate arrays (FPGAs) and other similar devices.

BACKGROUND

Modem integrated circuit designers are often confronted with the problem of developing new circuit/component designs in as short a time as possible in order to minimize product time to market. Although complicated, often this task becomes one of fitting a desired set of circuit components into as small an area as possible and arranging interconnecting conductors between those elements in a manner that minimizes the lengths of the conductive paths. To compound this problem, the design solution is usually subject to a minimum spacing geometry, dictated by the resolution limits (and other technology factors) of the fabrication process employed. When a designer develops a new circuit or component, he/she typically begins by creating a schematic for the design. Such design processes have been automated to some degree for a number of years and a typical schematic produced through such processes usually consists of symbols representing the basic units of the design connected together with signals (or nets—short for networks). The symbols are usually chosen from a library of parts that the designer draws upon to build the schematic. The interconnection of the symbols and the signals (e.g., as stored in a design database) creates the connections needed to specify the design such that a netlist can be derived from the connections. The netlist can then be used to create a simulation model of the design to verify its operation before the actual component is built.

The manner in which the schematic representation of the overall circuit is developed may vary depending upon whether fully custom or semi-custom circuit elements need to be employed in the design. Thus, circuit designers often begin by searching a standard library of circuit elements to see if any will match the new circuit's requirements. The search may begin at a relatively high level to determine whether any previously defined circuit elements satisfy the needed chip-level or lower level (called "cells") architectures. The number of hierarchical levels of cell structure will depend on the nature and complexity of the circuitry being designed.

If matching cells are found, the designer can proceed to synthesize the circuit. Otherwise, the designer may be required to build semi-custom cells from available low-level cells. In the event no existing circuit elements can satisfy the necessary design requirements, the designer may be forced to develop custom solutions. For example, decoding logic used in memory devices are typically custom implementations. Once the circuit elements have been chosen, the circuit is synthesized and optimized for a given set of technology rules (i.e., the design rules that describe limitations of the fabrication processes to be used). Commercial computer programs for performing such routines are available and are commonly used to perform such tasks.

The netlist produced during the synthesis and optimization process can be used to provide the information needed by a routing software package to complete the actual design. The routing software will create the physical connection data to create the layer information needed for the component specified by the design. The resulting design may then be simulated to test its behavior and, if necessary, the design can be modified to meet target design goals.

Once a design has been approved through simulation, tape out may be ordered. In the tape out process, the symbolic representation of the circuit is translated into an actual layout using a commercial layout editor program. As with the synthesis programs, layout editors utilize tables of design rules that are specific to the ultimate manufacturing process to be used to produce computer-readable files (masks) that can be used in the fabrication of the integrated circuit.

This conventional design methodology is flawed in as much as it requires that the designer be familiar with the specifics of the design language used to specify the components of the design. As design languages evolve and are replaced by new languages, this forces designers to relearn these languages. Further, this design procedure becomes tedious when designers are faced with developing an entire family of components, individual units of which may share some similarities but likely differ in other regards. Moreover, although conventional simulation tools often perform better (i.e., provide results more quickly) when the underlying circuit design is specified in terms of a hierarchical data structure, most conventional design tools do not provide such output. Rather, conventional design tools tend to provide so-called "flattened" data structures. Thus, simulation times (and, hence, overall design times) are often unnecessarily long.

Further deficiencies of these conventional design processes are also apparent where the circuit being designed is a CPLD, FPGS or similar device. CPLDs and other programmable logic devices rely on programmable interconnect matrices (PIMs) or similar interconnect paths to route signals within the device. In the past, see, e.g., U.S. Pat. No. 5,068,603, such PIMs have been organized as mask-defined, metalized interconnection arrays, which constitute multi-plane grids of metal-based routing lines and mask programmed interconnect segments. The mask programmed interconnect segments are included within or excluded from the programmable device in an automated fashion according to a computer-based design tool. The process by which interconnect segments are included or excluded is structured in such a manner that a chip manufacturer is able to provide an instruction tape to an automated mask-defining machine to produce the device.

Although useful, such schemes are manually intensive in as much as designers are forced to determine the layouts (and/or schematics) for the connections within the PIM before the automated tools can be used. Accordingly, what is needed is a scheme that allows for automation of such processes.

SUMMARY OF THE INVENTION

A programmable interconnect matrix (PIM) design, layout, schematic, netlist, abstract or other equivalent circuit representation (hereinafter "layout") is hierarchically generated by selecting one or more PIM layout tiles from a plurality of different PIM layout tiles, and automatically compiling a plurality of the selected PIM layout tiles into a PIM layout. In some cases, the PIM layout tiles can be heterogeneous. Generally, the PIM layout includes a PIM array having one of a plurality of different sizes (e.g., n rows by m columns, n and m>1). In other embodiments, a PIM connection scheme is generated by automatically compiling a plurality of PIM layout tiles into a PIM layout, then programming interconnects of the PIM according to a mapping table specifying desired interconnections. This scheme may include generating the mapping table with software configured to optimize connections and/or routability and/or automatically generating a PIM layout database from the PIM connection scheme. Either or both of these methodologies may be embodied as a set of computer-readable instructions for performing the methods.

Other features and advantages of the present invention are described below with reference to the accompanying drawings.

BRIEF DESCRIPTION OF THE DRAWINGS

The present invention is illustrated by way of example, and not limitation, in the figures of the accompanying drawings in which like reference numerals refer to similar elements and in which.

DETAILED DESCRIPTION

A scheme for the automated generation of PIMs for a programmable device is disclosed herein. Although discussed with reference to certain illustrated embodiments, upon review of this specification, those of ordinary skill in the art will recognize that the present methodologies may find application in a variety of computer-aided design, synthesis and/or simulation schemes. Therefore, in the following description the illustrated embodiments should be regarded as exemplary only and should not be deemed to be limiting in scope.

As will be apparent, one aspect of the automated design scheme involves the use of a look-up table that provides interconnect information of nets (connections)/terminals. In addition, a PIM mapping table provides mapping information for general input/output (I/O) devices to actual pin names used in the layout and/or schematics. Using these tools and the methodologies described below, the present scheme allows for the automated tiling of different size PIMs for a programmable device. Such tiles may include any one of a number of different memory elements (e.g., SRAM cells or non-volatile memory such as PROM, EPROM, EEPROM, antifuse elements, etc.) in addition to interconnect elements. Automated programming of the connections into the tiled PIM array, which can be heterogeneous, is also supported. By using the PIM connection tables to drive the PIM generation software, the present scheme avoids the prior manual process of mapping such connections, thus leading to faster, less error prone, solutions.

In accordance with the present methods, all input signals and connectivity to a PIM are defined in a PIM table (e.g., a look-up table or other data structure stored in a computer-readable medium such as a memory). This information is used to build a PIM, which will be defined in terms of a data structure organized as a number of "slices". All PIM slices that describe a single PIM may be homogeneous, however, as some CPLDs and similar devices have more than one PIM, different PIM data structures for the same device may have PIM slices that are not homogeneous. In other words, the configuration of PIM slices in different devices or in different PIMs of the same device may vary with the use of different PIM leaf cells from which the slices are generated.

In general, a CPLD or similar device will be made up of a number of logic blocks (sometimes called macrocells), with routing interconnects (i.e., PIMs) disposed therebetween. The PIMs route signals into/out of and within (e.g., in a feedback manner) the macrocells. This general structure may thus be used to create a design database for the PIM layout.

Figure 1:
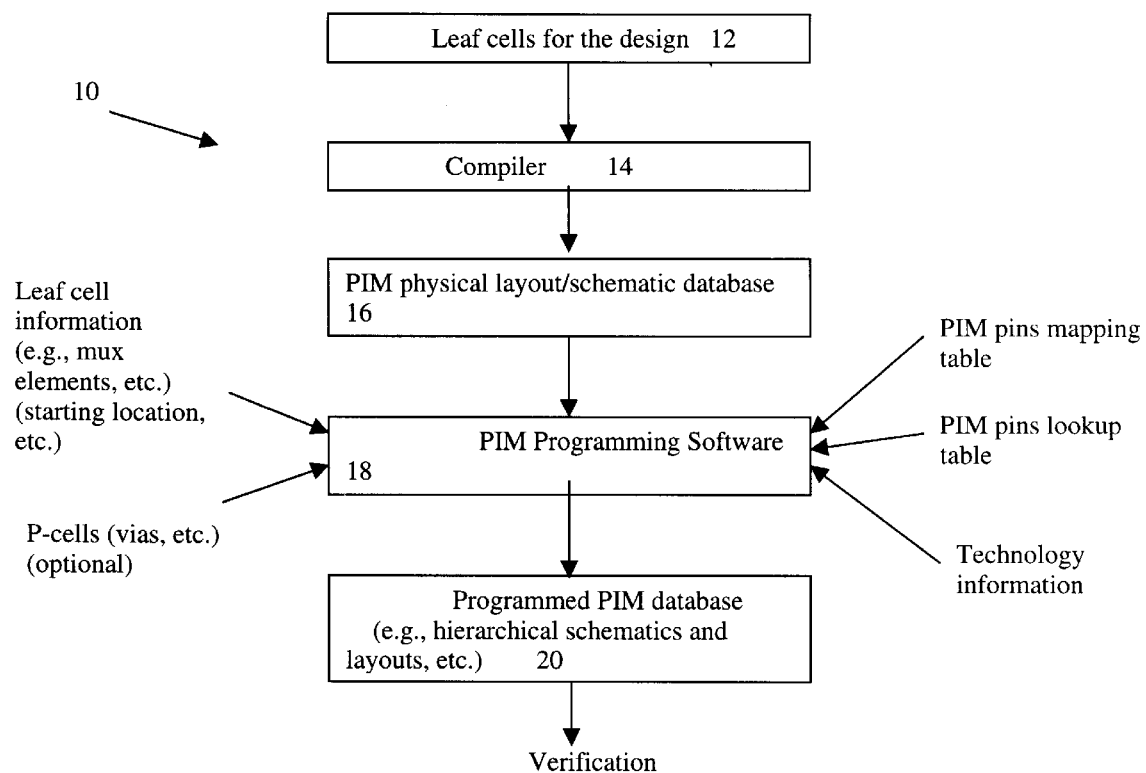
FIG. 1 illustrates the overall process of producing a PIM layout according to an embodiment of the present invention.

The general process 10 for creating such a design database is illustrated in FIG. 1. Initially, at step 12, leaf cells for the design are defined. A leaf cell is usually the lowest level cell to be used in a design and in the case of a PIM may include interconnection elements as well as the above-mentioned memory elements. Usually, the leaf cell will include sufficient information to take care of typically desired routing between adjacent logic blocks of the programmable device and/or their respective inputs and outputs.

The leaf cells are organized and compiled (step 14), for example using an automated compiler tool. Compilation is usually performed for a given set of technology rules, with specific cells (e.g., leaf cells) created for that technology. The technology rules may define the compiler array structures, dependencies, defaults, etc. The technology rules are usually embodied as a library, which may exist as a SKILL™ structure (i.e., a series of property lists). At the root level, the technology rules may describe how the compile blocks are to be constructed using the leaf cells in the library. Thus, a user may automatically (e.g., according to a set of computer-readable instructions, for example to be executed by a computer system) generate a design, layout, schematic, netlist, abstract or other equivalent circuit representations (collectively referred to as a "layout") for a PIM. The user inputs, or at least a subset thereof, are used to first generate one or more leaf cells, then using the leaf cells, the design database for the layout is created (step 16). The design database for the PIM is preferably hierarchical in nature and is not merely a flattened data structure.

Figure 2:
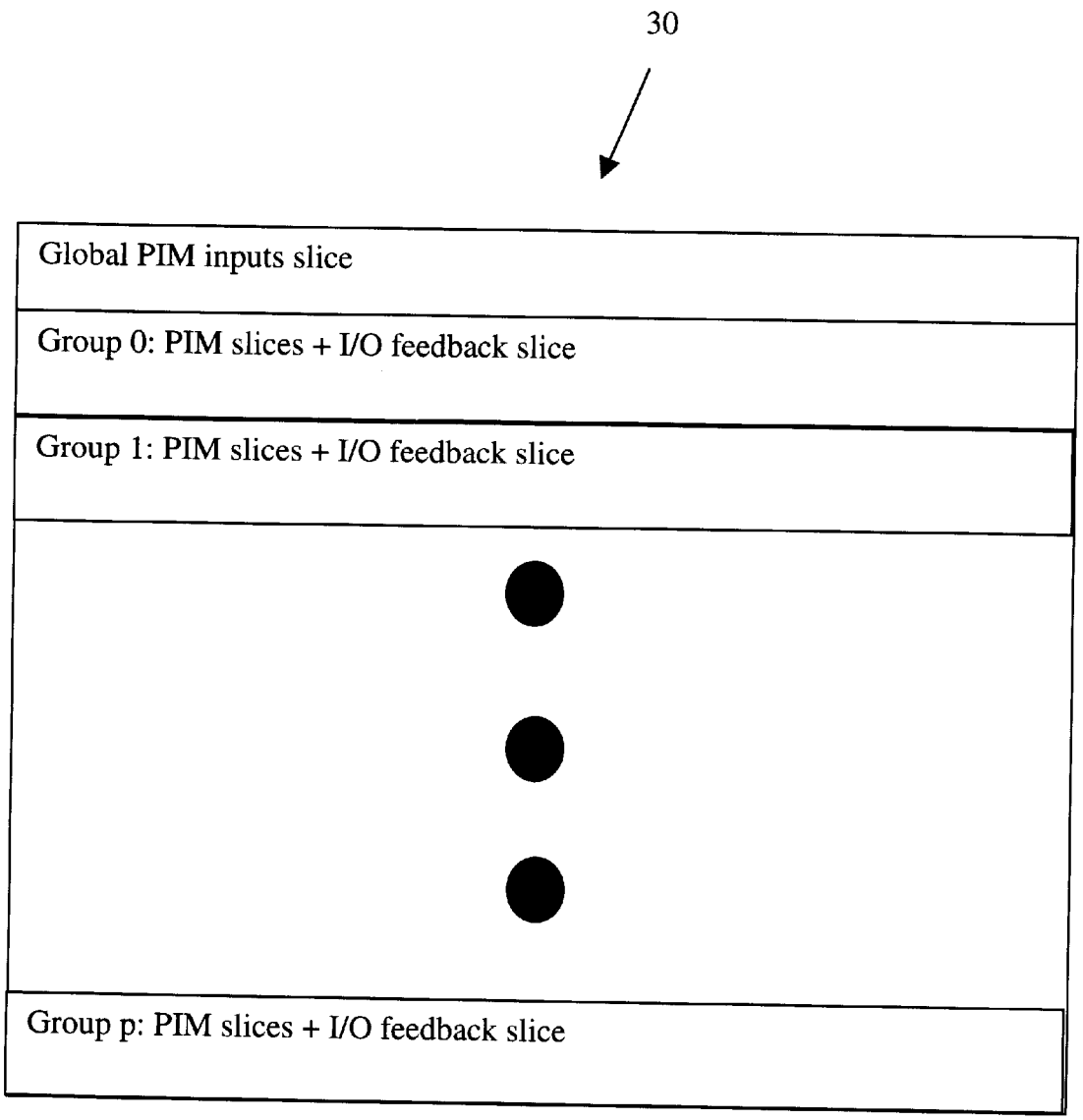
FIG. 2 illustrates an example of a PIM design database produced in accordance with an embodiment of the present invention.

FIG. 2 illustrates an example of such a PIM layout database. The design database 30 is made up of a number of slices. The slices represent the interconnection information that is used to develop the signal routing paths within the PIN. Vertically, the slices are divided into groups, between which is introduced an I/O and/or macrocell feedback connection row. This type of vertically configured data structure may be used for base die layout compilation for the PIMs of each of a family of devices. The particular configuration of a PIM slice and/or I/O feedback slice within the data structure will be determined by the PIM tables for that device.

Each PIM slice in the data structure is developed from one or more leaf cells (i.e., the lowest level components chosen from a design library). A PIM leaf cell may have a number (e.g., up to 14 or more) input and/or output signals that correspond to metalization tracks (vertical and/or horizontal) in a finished product. Further, for multiplexer-based PIMs, the leaf cells will have a number of multiplexers (the number depends upon the routability of the PIM design). Other types of PIMs will have different selection elements. In general though, the leaf cells will have via contacts (or other interconnect elements) that provide points of connection between a metalization track and the input or output of a multiplexer (or other selection element). The placement of the contacts is specified in the PIM table for the device under design. The placement of such via contacts may be subject to design rules that depend upon the fabrication technology to be employed.

In addition to via contacts for multiplexer inputs, such contacts are also needed for routing feedback signals to/from macrocells or other level logic blocks. Again, this connectivity information is defined in the PIM and I/O mapping tables for the device.

Returning to FIG. 1, the actual programming of the connectivity information is accomplished at a programming step 18. Here, inputs from the PIM tables mentioned above (i.e, the pin mapping tables, leaf cell information and pin look-up tables, etc.), along with design technology files (e.g., that specify the design rules for the fabrication processes to be employed) are used to produce a programmed PIM database (step 20). Within these processes, the PIM tables are read and used to place via contacts to the multiplexers within a PIM leaf cell. Then, the PIM table and I/O mapping table (i.e., the pin mapping table) may be used to place the via contacts to the input/output connections. Finally, these two mappings may be overlaid on one another to produce an overall PIM layout hierarchy which may be subsequently verified using conventional circuit verification techniques.

Thus a scheme for the automated design of PIMs and/or components thereof has been described. The PIM may be specified as a design database, layout, schematic, netlist, abstract or other equivalent circuit representation (hereinafter "layout"). Usually, the layout is hierarchically generated by selecting one or more PIM layout tiles (i.e., leaf cells) from a plurality of different PIM layout tiles (as may be organized in a design library), and automatically compiling the selected PIM layout tiles into a PIM layout. In some cases, the PIM layout tiles can be heterogeneous, for example where different PIMs of a common device employ different leaf cells.

Generally, the PIM layout (e.g., the hierarchical design database described above) includes a PIM array having one of a plurality of different sizes (e.g., n rows by m columns, n and m>1). The rows and columns are defined by the metalization lines in the leaf cells and/or the interconnections thereof. The PIM connection scheme may be generated by programming these interconnects of the PIM according to one or more mapping tables specifying the desired interconnections. The mapping tables themselves may be generated with software configured to optimize connections and/or routability for the programmable device.

Although the foregoing description and accompanying figures discuss and illustrate specific embodiments, it should be appreciated that the present invention is to be measured only in terms of the claims that follow.

What is claimed is:

1. A method for generating a programmable interconnect matrix (PIM) design, layout, schematic, netlist, abstract or other equivalent circuit representation (hereinafter "layout"), comprising:

a) selecting more than one PIM layout tile from a plurality of different PIM layout tiles; and b) automatically compiling a plurality of the selected PIM layout tiles into a PIM layout wherein said PIM layout comprises a hierarchical structure wherein the fundamental component is a leaf cell.

2. The method of claim 1, wherein the PIM layout tiles are heterogeneous.

3. The method of claim 1, wherein the PIM layout comprises a PIM array having one of a plurality of different sizes (e.g., n rows by m columns, n and m >1).

4. A method for generating a programmable interconnect matrix (PIM) connection scheme, comprising:

a) automatically compiling a plurality of PIM layout tiles into a PIM layout, wherein said PIM layout comprises a hierarchical structure wherein the fundamental component is a leaf cell, then b) generating the PIM connection scheme by programming interconnects of the PIM according to a mapping table specifying desired interconnections.

5. The method of claim 4, further comprising generating the Mapping table with software configured to optimize connections and/or routability.

6. The method of claim 4 further comprising automatically generating a PIM layout database from the PIM connection scheme.

7. A set of computer-readable instructions for performing the method set forth in claim 1.

8. A set of computer-readable instructions for performing the method set forth in claim 4.

* * * * *